United States Patent Office 3,158,471
Patented Nov. 24, 1964

3,158,471

GOLD ALLOY SOLDER FOR SEMICONDUCTOR DEVICES

Kurt Kadelburg, Los Angeles, Calif., assignor to International Rectifier Corporation, El Segundo, Calif., a corporation of California No Drawing. Filed Nov. 29, 1962, Ser. No. 241,043
3 Claims. (Cl. 75—165)

This invention relates to a novel solder composition, and more specifically relates to a solder for securing a contact to a semiconductor element.

Solders for securing metallic contacts to semiconductor crystals are well known to the art, and a typical solder is shown in copending application Serial No. 225,763, filed September 24, 1962, entitled Alloy Contact, in the name of Kurt Kadelburg, and assigned to the assignee of the present invention.

The novel composition of the invention is a solder which permits the wetting of conductive contact plates which are used as the contacts of a semiconductor wafer such as silicon.

In assembling the elements of a semiconductor device such as a rectifier, it is often necessary to solder a silicon wafer which has one or more junctions formed therein to a contact plate and to external leads or heat sinks. A typical contact plate preferablly has the same thermal characteristics as the silicon, and commonly is formed of tungsten or molybdenum.

The present soldering compositions used require some of the bonding agents which can be handled at low temperature or hard bonding agents which require application of extremely high temperatures in the formation process for the complete unit.

The present compositions provides a bonding material which can be processed at some time after the original processing of the junction within the semiconductor wafer and the processing of the contact plates. It is necessary for this solder to appropriately wet the contact plates as where a tungsten plate is used. Thus, in the above noted copending aplication Serial No. 225,763, the alloy had a gold boron medium therein which was found to appropriately wet the tungsten.

The novel composition of the present invention utilizes a basic tin-gold solder of the type well known, and adds thereto a small percentage of silver or a small percentage of a silver and germanium alloy. By way of example, a formulation having 80% gold and 20% tin can have added thereto approximately 4% of a silver germanium alloy which is comprised of the order of 96% silver and 4% germanium.

When such a solder is used, it is found that an effective bond will be formed between a silicon wafer and a tungsten contact plate where the solder wets tungsten and silicon when the temperature is raised to the order of 300° C.

Accordingly, a primary object of this invention is to provide a novel solder for securing contact plates to semiconductor wafers.

Another object of this invention is to provide a novel solder which is relatively soft and which will wet tungsten at relatively low temperatures.

In accordance with the above noted description, a typical solder formed in accordance with the present invention was formed by a basic tin-gold solder which is comprised of 1 gram of gold to 0.2 gram of tin. This is combined with 0.05 gram of a silver-germanium alloy wherein the latter alloy is formed of 96% silver and 4% germanium.

A wafer of this solder was formed and interposed between a disc of tungsten and a disc of silicon in its pure state.

The temperature was then raised to approximately 300° C. where it was found that the solder was able to wet the silicon and the tungsten, whereupon, after cooling to room temperature, a good bond was formed between the tungsten contact plate and the silicon wafer. Other experiments show that the alloy wets perfectly to aluminum, nickel, silver and other metals.

In a second experiment, the 0.05 gram of silver-germanium alloy was replaced by 0.05 gram of pure silver where a solder was again formed.

Although this invention has been described with respect to its preferred embodiments, it should be understood that many variations and modifications will now be obvious to those skilled in the art, and it is preferred, therefore, that the scope of this invention be limited not by the specific disclosure herein but only by the appended claims.

What is claimed is:

1. A solder for soldering metallic contacts to a silicon wafer; said solder consisting essentially of approximately 80% by weight of gold, 16% by weight of tin, and 4% silver.

2. A solder for soldering metallic contacts to a silicon wafer; said solder consisting essentially of approximately 80% by weight of gold, 16% by weight of tin, and 4% by weight of silver alloy; said silver alloy being formed of approximately 96% silver and 4% germanium.

3. A solder composition for wetting tungsten at approximately 300° C. consisting essentially of 80% by weight of gold, 16% by weight of tin, and 4% by weight of silver.

References Cited in the file of this patent

UNITED STATES PATENTS

| | | |
|---|---|---|
| 1,561,247 | Kingsbury | Nov. 10, 1925 |
| 2,189,640 | Powell | Feb. 6, 1940 |